(12) United States Patent
Morand et al.

(10) Patent No.: US 7,829,916 B2
(45) Date of Patent: Nov. 9, 2010

(54) TRANSISTOR WITH A GERMANIUM-BASED CHANNEL ENCASED BY A GATE ELECTRODE AND METHOD FOR PRODUCING ONE SUCH TRANSISTOR

(75) Inventors: Yves Morand, Grenoble (FR); Thierry Poiroux, Voreppe (FR); Maud Vinet, Rives (FR)

(73) Assignee: Commissariat a L'Energie Atomique, Paris (FR)

( * ) Notice: Subject to any disclaimer, the term of this patent is extended or adjusted under 35 U.S.C. 154(b) by 292 days.

(21) Appl. No.: 11/920,835

(22) PCT Filed: May 23, 2006

(86) PCT No.: PCT/FR2006/001177

§ 371 (c)(1),
(2), (4) Date: Nov. 21, 2007

(87) PCT Pub. No.: WO2006/131615

PCT Pub. Date: Dec. 14, 2006

(65) Prior Publication Data

US 2009/0127584 A1 May 21, 2009

(30) Foreign Application Priority Data

Jun. 6, 2005 (FR) .................................. 05 05700

(51) Int. Cl.
*H01L 29/66* (2006.01)
*H01L 21/44* (2006.01)
(52) U.S. Cl. ....................... 257/192; 257/194; 257/256; 257/E29.14; 438/663
(58) Field of Classification Search ................. 257/194, 257/256, 192, E29.14; 438/663
See application file for complete search history.

(56) References Cited

U.S. PATENT DOCUMENTS

2003/0215989 A1* 11/2003 Kim et al. .................... 438/157
2004/0063286 A1   4/2004 Kim et al.
2005/0093021 A1*  5/2005 Ouyang et al. ............... 257/194
2006/0113524 A1*  6/2006 Bill et al. ...................... 257/40

OTHER PUBLICATIONS

Lee S. et al., "A Novel Sub-50 nm Multi-Bridge-Channel MOSFET (MBCFET) with Extremely High Performance," 2004, VLSI Technology, Digest of Technical Papers, pp. 200-201.
Yang F. et al., "5nm-Gate Nanowire FinFET," 2004, VLSI Technology, Digest of Technical Papers, pp. 196-197.

* cited by examiner

*Primary Examiner*—Jerome Jackson, Jr.
*Assistant Examiner*—Dale Page
(74) *Attorney, Agent, or Firm*—Oliff & Berridge, PLC

(57) ABSTRACT

Source and drain electrodes are each formed by an alternation of first and second layers made from a germanium and silicon compound. The first layers have a germanium concentration comprised between 0% and 10% and the second layers have a germanium concentration comprised between 10% and 50%. At least one channel connects two second layers respectively of the source electrode and drain electrode. The method comprises etching of source and drain zones, connected by a narrow zone, in a stack of layers. Then superficial thermal oxidation of said stack is performed so a to oxidize the silicon of the germanium and silicon compound having a germanium concentration comprised between 10% and 50% and to condense the germanium Ge. The oxidized silicon of the narrow zone is removed and a gate dielectric and a gate are deposited on the condensed germanium of the narrow zone.

18 Claims, 5 Drawing Sheets

TRANSISTOR WITH A GERMANIUM-BASED CHANNEL ENCASED BY A GATE ELECTRODE AND METHOD FOR PRODUCING ONE SUCH TRANSISTOR

BACKGROUND OF THE INVENTION

The invention relates to a transistor comprising at least one channel encased by a gate electrode, and source and drain electrodes each formed by an alternation of first silicon-based layers and second layers made from a germanium and silicon compound.

STATE OF THE ART

To produce integrated circuits in microelectronics, it is sought to reconcile a very large interconnection density with a large quantity of current. In the literature, to improve the performances of CMOS-on-silicon transistors, modifications are proposed concerning the architecture of the transistors and the materials used.

Double gate (DG) and gate-all-around (GAA) architectures for example present very low leakage currents and higher saturation currents than single gate (SG) transistors, for a given gate length.

The article "A Novel Sub-50 nm Multi-Bridge-Channel MOSFET (MBCFET) with Extremely High Performance" by S.-Y. Lee et al. (2004 Symposium on VLSI Technology) describes multi-channel transistors having all-around gates. These transistors present excellent static performances and provide a very large interconnection density compared with the current flow level. However, their fabrication principle is based on stacking of silicon-germanium (SiGe) and silicon (Si) layers by epitaxy and on selective etching of the SiGe with respect to the Si to achieve suspended channels, which means that the channel material has to be either silicon or silicon-germanium. Moreover, this architecture intrinsically presents high stray capacitances due to the fact that it is difficult to achieve spacers between the channels.

The article "5 nm-Gate Nanowire FinFET" by F. L. Yang et al. (2004 Symposium on VLSI Technology) describes a transistor having a cylindrical channel completely surrounded by the gate. This transistor presents a very good electrostatic control of the channel by the gate, which enables a transistor having a gate length as small as 5 nm to be achieved.

Concerning the materials used, pure germanium presents a mobility that is twice as great for electrons and four times greater for holes than silicon. The drawback with germanium transistors is the cost of the substrate which is about 10 times higher than that of a bulk silicon substrate. In addition, it is very difficult to stack several germanium channels by epitaxy of good quality germanium on a silicon substrate. Furthermore, fabrication of these transistors requires numerous developments due to the instability of germanium oxide.

The document US2003/0215989 describes a transistor comprising a channel surrounded by gate electrode. The channel is formed by the central part of a silicon layer. A SiGe layer is removed in the zone located under the channel so as to release the space for the gate electrode. The source and drain electrodes correspond to the zones located on each side of the channel. The source and drain are formed by ion implantation in active layers. The source and drain electrodes are each formed by an alternation of first and second layers. The first layers are made of silicon. The second layers have a germanium concentration comprised between 20% and 30%. The channel thus connects two first layers of silicon of the stack forming the source and drain electrodes.

OBJECT OF THE INVENTION

One object of the invention is to propose a transistor enabling a very high interconnection density and a large quantity of current to be obtained, while using standard methods, in particular silicon transistor integration methods.

According to the invention, this object is achieved by the appended claims and more particularly by the fact that the channel is germanium-based, the first layers being made from a germanium and silicon compound with a germanium concentration comprised between 0% and 10% and the second layers having a germanium concentration comprised between 10% and 50%, the channel connecting two second layers respectively of the source and drain electrodes.

A further object of the invention is to provide a method for producing a transistor, successively comprising:
  production of an alternation of first and second layers of germanium and silicon compound on a substrate, the first layers having a germanium concentration comprised between 0% and 10% and the second layers having a germanium concentration comprised between 10% and 50%,
  etching, in said stack, of source and drain zones designed to form the source and drain electrodes, and of a narrow zone connecting the source and drain zones,
  superficial thermal oxidation of said stack so as to oxidize the silicon of the germanium and silicon compound in the narrow zone, the compound having a germanium concentration comprised between 10% and 50% and so as to condense the germanium,
  removing the oxidized silicon from the narrow zone,
  deposition of a gate dielectric on the condensed germanium of the narrow zone,
  deposition of a gate metal on said gate dielectric.

BRIEF DESCRIPTION OF THE DRAWINGS

Other advantages and features will become more clearly apparent from the following description of particular embodiments of the invention given as non-restrictive examples only and represented in the accompanying drawings, in which.

DESCRIPTION OF PARTICULAR EMBODIMENTS

Figure 1:
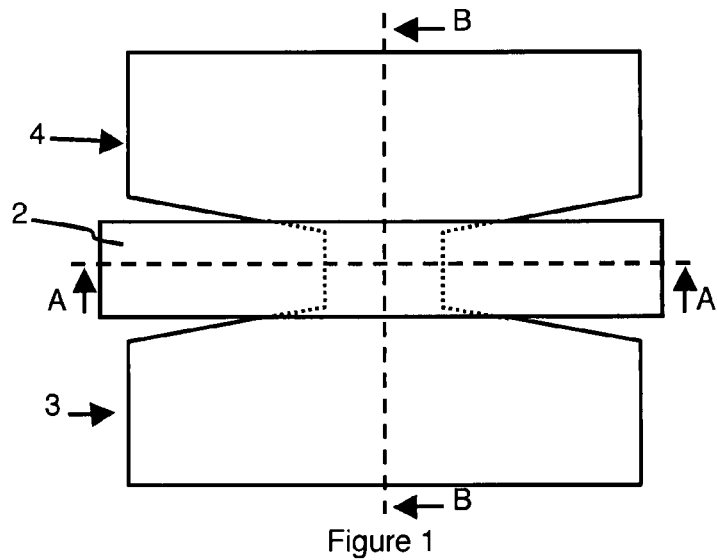
FIGS. 1 to 3 represent a particular embodiment of a transistor according to the invention, respectively in top view, in cross-section along the line B-B, and in cross-section along the line A-A.
Figure 2:
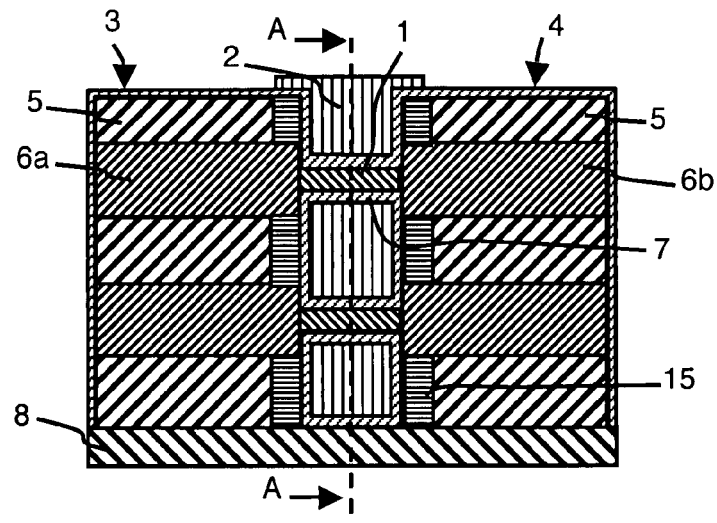
Figure 3:
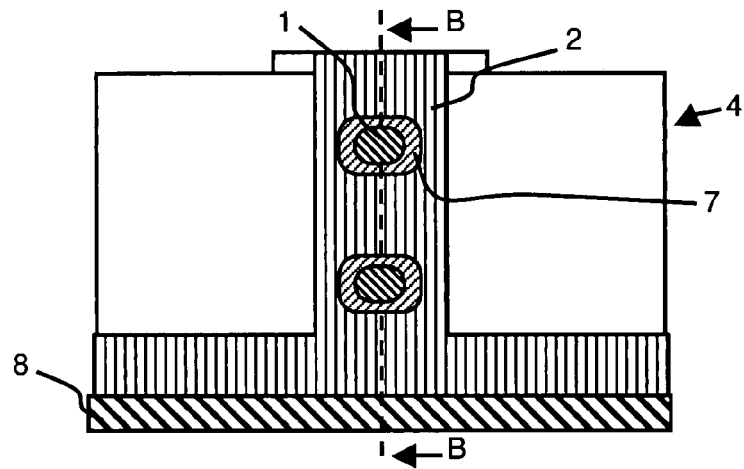

In the particular embodiment represented in FIGS. 1 to 3, a transistor comprises two channels 1 surrounded by a gate electrode 2. The channels 1 are germanium-based. The transistor comprises a source electrode 3 and a drain electrode 4 which are each formed by an alternation of first layers 5 and second layers 6 of germanium and silicon compound. The first layers 5 have a germanium concentration comprised between 0% and 10% and the second layers 6 have a germanium concentration comprised between 10% and 50%.

The first layers 5 are for example made of silicon. All the second layers 6 can have the same germanium concentration. For example, the first layers 5 are made of Si and the second layers 6 of $SiGe_x$, so as to obtain a $SiGe_x/Si/SiGe_x/Si$ stack.

The second layers 6 can also have different germanium concentrations. For example, the second layers 6 are respectively made of $SiGe_x$, $SiGe_y$ and $SiGe_z$ and the first layers 5 are made of Si so as to obtain a $SiGe_x$/Si/$SiGe_y$/Si/$SiGe_z$/Si stack.

The first layers 5 are not necessarily made of silicon. For example the first layers 5 also contain germanium so as to obtain a $SiGe_t$/$SiGe_v$/$SiGe_w$/$SiGe_x$/$SiGe_y$/$SiGe_z$ stack, the first layers having a germanium concentration of less than 10% and the second layers having a germanium concentration comprised between 10% and 50%.

The top layer of the stack of layers 5 and 6 is preferably a first layer of silicon.

Advantageously, the first and/or second layers 5, 6 can be doped during growth by injecting precursors such as diborane, phosphine, or arsine. Each channel connects two second layers 6 of SiGe, respectively of the source electrode 3 and drain electrode 4. The channels 1 are separated from the gate electrode 2 by a gate dielectric 7. As represented in FIG. 2, the source electrode 3 and drain electrode 4 are preferably separated from the gate electrode 2 by spacers 15 and by the gate dielectric 7. For example a part of the first layers 5 arranged facing the channel 1 is oxidized before deposition of the gate dielectric 7 so as to produce the spacers 15 between the first layers 5 of the source 3 and drain 4 and the gate electrode 2.

In FIG. 2, the upper channel 1 connects the second upper layer 6a of the source electrode 3 to the second upper layer 6b of the drain electrode 4. The layers 5 and 6 are formed in parallel manner on a substrate 8. The second upper layer 6a is arranged at a predetermined level of the alternation of layers of the source electrode 3 and also at a predetermined level with respect to the substrate 8. In the same way, the corresponding second upper layer 6b of the drain electrode 4 is arranged at a predetermined level of the alternation of layers of the drain electrode 4 and also at a predetermined level with respect to the substrate 8. The second upper layers 6a and 6b corresponding to the same channel 1 are therefore at the same level.

In FIG. 2, the two second layers 6 connected by a channel 1 and the channel 1 are arranged in the same plane parallel to the substrate 8, as represented by the line C-C. As represented in FIG. 3, the gate electrode 2 completely encases the channel 1.

Figure 4:
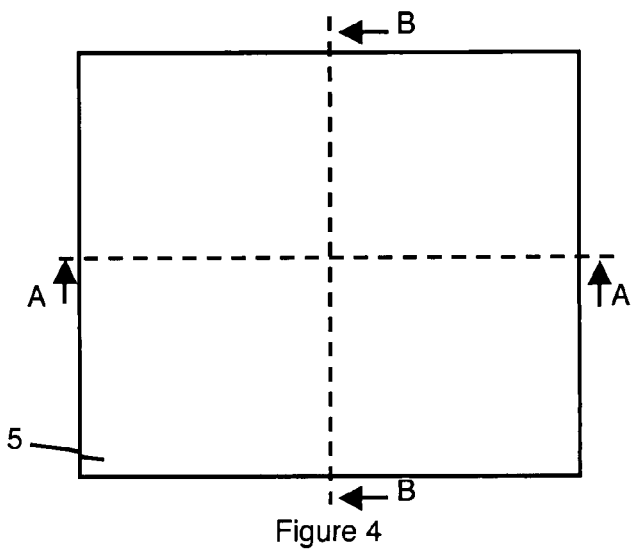
FIGS. 4 to 6, 7 to 9, 10 to 12 and 13 to 15 respectively represent four steps of a particular embodiment of a method for producing a transistor according to the invention, respectively in top view, in cross-section along the line B-B, and in cross-section along the line A-A.
Figure 5:
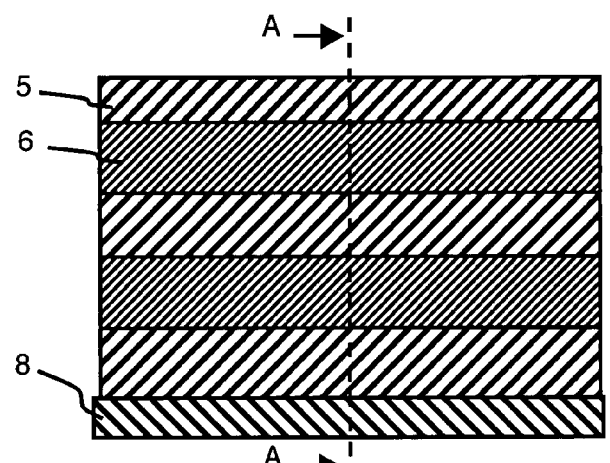
Figure 6:
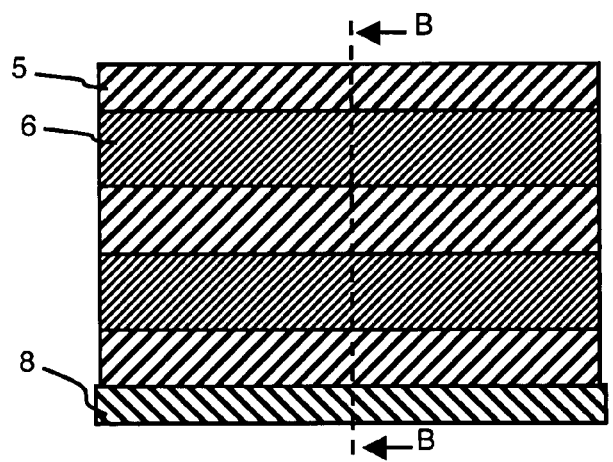

A method for producing a transistor according to the invention comprises production, on the substrate 8, of a stack of alternate layers 5 and 6 respectively made of Si and SiGe, as represented in FIGS. 4 to 6. The stack is achieved for example by SiGe/Si heteroepitaxy on a silicon on insulator (SOI) substrate. The thickness of the SiGe second layers 6 is preferably comprised between 5 nanometers and 30 nanometers. The thicknesses of the first and second layers 5 and 6 are for example each about ten nanometers. The germanium concentration of the second layers is preferably 30%. The number of second layers 6 of SiGe determines the number of germanium-based channels 1 formed by the method.

The stack of alternate layers 5 and 6 can be protected by a protective layer (not shown), for example a layer of silicon nitride, protecting the external faces of the stack against subsequent oxidation.

Figure 7:
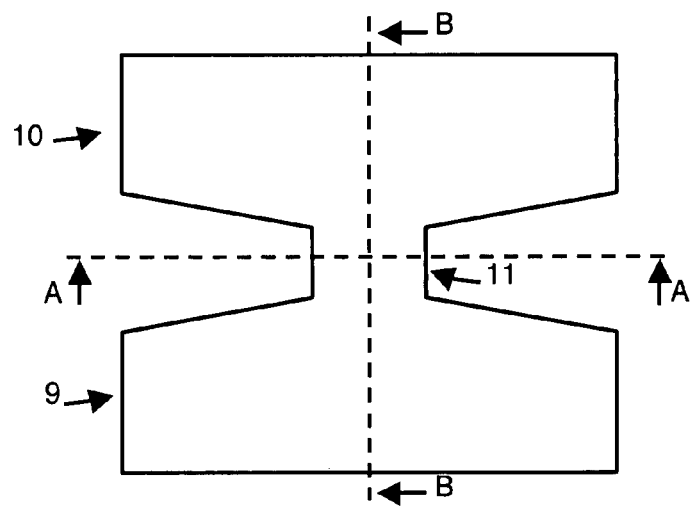
Figure 8:
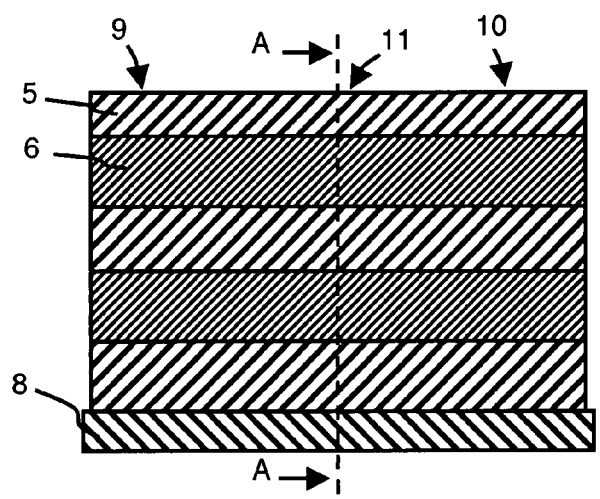
Figure 9:
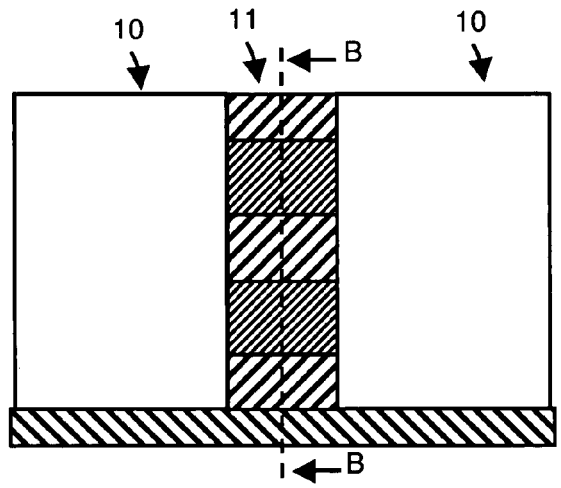

Then a source zone 9 and a drain zone 10 designed to respectively form the source electrode 3 and drain electrode 4, and a narrow zone 11 connecting the source zone 9 to the drain zone 10, are delineated by etching (FIGS. 7 to 9) in said stack. Said zones (9, 10 and 11) are for example delineated by deposition of a photoresist, lithography (for example photolithography or electronic lithography) of the photoresist, anisotropic plasma etching of the stack of layers 5 and 6 and removal of the photoresist. The alternations of layers 5 and 6 forming the source electrode 3 and drain electrode 4 are in this way formed in the same stack of layers 5 and 6. The narrow zone 11 corresponds to the location of the subsequently formed channels 1. The narrow zone 11 has lateral dimensions comprised between 3 and 50 nanometers and longitudinal dimensions of more than 5 nanometers and able to reach micrometric dimensions.

Figure 10:
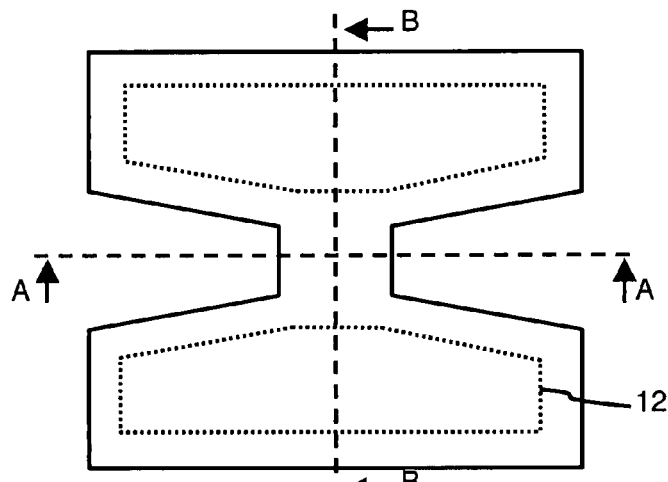
Figure 11:
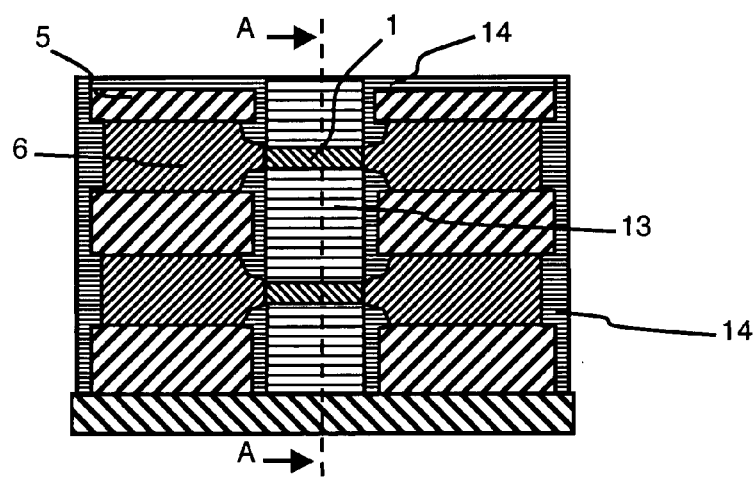
Figure 12:
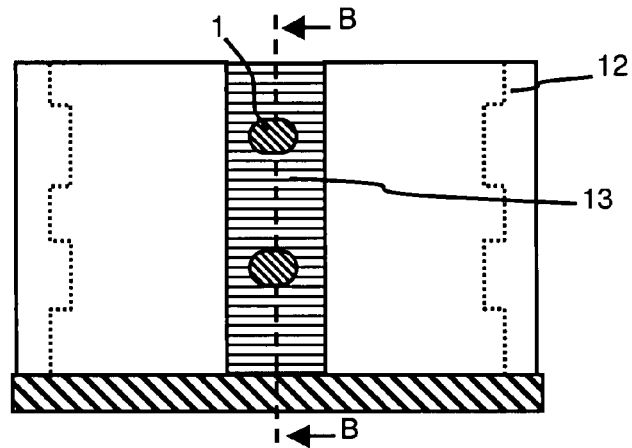

Superficial thermal oxidation of said stack, represented in FIGS. 10 to 12, is then performed. The oxygen enters the stack of layers down to a predetermined depth represented by a broken line 12 in FIG. 10. The inside of the source electrode 3 and drain electrode 4 is therefore not oxidized when thermal oxidation takes place. In the particular embodiment represented in FIGS. 10 to 12, the silicon of the narrow zone 11 is completely oxidized when thermal oxidation is performed. The whole of the silicon of the part of the layers 5 and 6 corresponding to the narrow zone, i.e. the silicon of layers 5 of silicon and silicon of layers 6 of silicon germanium. In the narrow zone 11, the SiGe is thus condensed inside the parts of the layers 6 corresponding to the narrow zone 11 and concentrated on a central axis of the layers 6 connecting the source 3 and drain 4 so as to form the germanium-based channels 1, whereas the silicon forms an oxide 13 at the surface of the germanium-based channel. The dimensions of the germanium-based channels are determined by the lateral and longitudinal dimensions of the narrow zone 11 and by the thicknesses of the second layers 6 of SiGe and by the initial germanium concentration of the SiGe. In FIGS. 11 and 12, the parts of the first layers 5 of silicon corresponding to the narrow zone 11 are completely transformed into silicon oxide 13. In FIG. 11, a superficial oxide layer 14 is arranged on the walls of the source electrode 3 and drain electrode 4.

Figure 15:
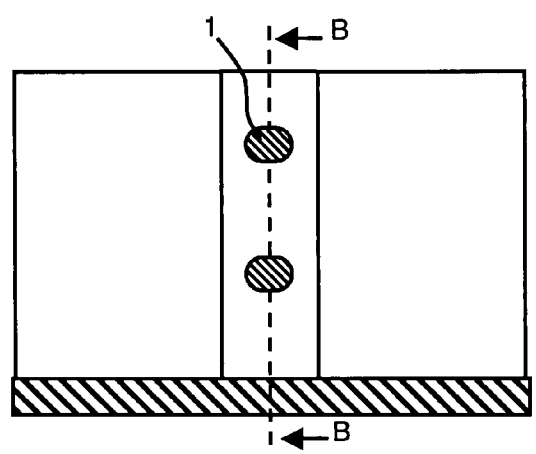

The germanium condensation phenomenon, i.e. the increase of the germanium concentration of a silicon and germanium SiGe compound when it is subjected to oxidizing treatment, is usually used for fabrication of germanium on insulator substrates. In the present case where the narrow zone 11 is oxidized laterally via its two sides, condensation of the germanium automatically results in substantially cylindrical channels, as represented in FIGS. 12, 15 and 3. The cylindrical shape of the channels in particular enables very good electrostatic control of the channel by the gate to be subsequently achieved.

Figure 13:
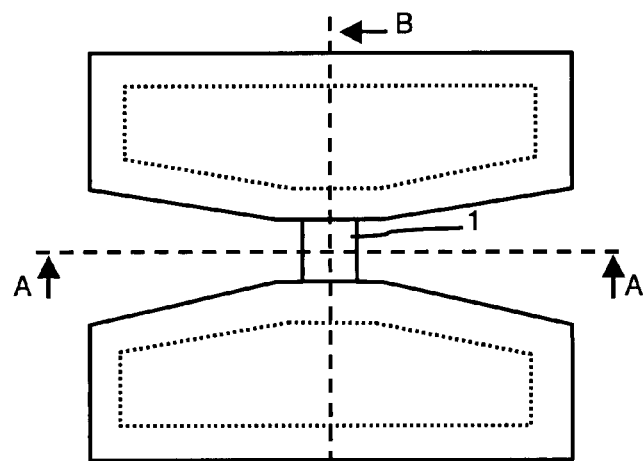
Figure 14:
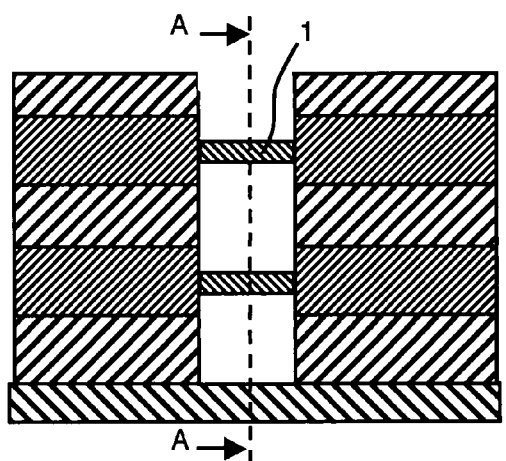

Then, as represented in FIGS. 13 to 15, the silicon oxide 13 of the narrow zone 11 is eliminated to release the channels 1. Elimination of the silicon oxide 13 can be accompanied by selective etching of the residual silicon of the narrow zone 11 located between the channels 1, when prior thermal oxidation is performed so as to only partially oxidize the silicon of the first layers 5 of the narrow zone 11. The silicon of the first layers 5 can in fact oxidize less quickly than SiGe. The channels 1 are thus completely released by means of selective etching of the residual silicon (not shown). Advantageously, to increase the oxidizing speed, a layer of doped silicon is deposited during the epitaxy steps.

Advantageously, additional thermal oxidation is performed to reduce the stray capacitances of the transistor. All the uncovered materials therefore undergo oxidation, in particular the silicon and the germanium-based channels. The germanium oxide can then be selectively eliminated and the silicon oxide be left intact by cleaning presenting a selectivity of etching of the germanium oxide with respect to the silicon oxide, for example rinsing with water. This results in a thickness of silicon oxide (not represented) on the silicon edges enabling the stray capacitances of the transistor to be greatly reduced.

Advantageously, after the step of eliminating the oxidized silicon of the narrow zone, a step of producing the spacers 15 (FIG. 2) is performed by oxidation (for example thermal or plasma oxidation) followed by selective dissolution of the germanium oxide in water.

After the channels 1 have been released, the gate dielectric 7 (for example a material having a Hf, Si, O or N base, for example HfO2, HfSiON or a material such as LaAlO3) is deposited on the condensed germanium constituting the channels 1 so as to encase the channels 1. The gate dielectric 7 is also deposited on the source 3 and drain 4, as represented in FIG. 2.

Then a gate material, for example a metal (for example TiN, WSi, TaN) or a semiconductor (for example polycrystalline silicon, polycrystalline germanium, SiGe), is deposited on the gate dielectric 7 so as to encase the assembly formed by the channels 1 and the dielectric 7 thereby forming an all-around gate 2, as represented in FIGS. 2 and 3. The fact that the gate 2 encases the channel 1 gives excellent control of short-channel effects. The gate 2 is for example achieved by depositing a metallic layer on the whole of the stack of layers 5 and 6 and channels 1, followed by photoresist deposition, photolithography of the photoresist, anisotropic etching of the metallic layer and removal of the photoresist. The gate 2 is thereby delineated so as to fill the space between the channels 1 and so as to completely cover the narrow zone 11 and the adjacent part of the source electrode 3 and drain electrode 4, as represented in FIG. 2. The dimensions of the gate 2 correspond notably to the lateral and longitudinal dimensions of the channels 1, to which the alignment tolerance of the lithography tool used is added, typically 20 nm for electron jet equipment and 60 nm for photolithography equipment, for example UV, deep UV or extreme UV.

Before the gate dielectric 7 is deposited on the germanium constituting the channels 1, selective doping of the two zones 9 and 10 designed to constitute the source electrode 3 and drain electrode 4 can be performed in known manner. The selective doping can for example be performed by means of ion implantation. The ion energies can be selected such as to dope the source 3 and drain 4 whereas the ions simply pass through the channels 1 without doping the latter.

The invention is not limited to the particular embodiments represented. In particular, the number of channels can be more or less than two. Several channels arranged one above the other in particular enable a better interconnection density to be obtained. Different standard steps can be added to the production method, for example producing spacers, doping steps of the source and drain zones or silicidation of the source and drain zones.

The invention claimed is:

1. A transistor comprising:
    first layers made from a germanium and silicon compound with a germanium concentration between 0% and 10%,
    second layers made from a germanium and silicon compound with a germanium concentration between 10% and 50%,
    a source electrode and a drain electrode, each formed by alternating the first layers and the second layers,
    a channel connecting one second layer of the source electrode to one second layer of the drain electrode, wherein the channel has a greater germanium concentration than the second layer, and
    a gate electrode encasing the channel.

2. The transistor according to claim 1, wherein the first layers are made of silicon.

3. The transistor according to claim 1, wherein the second layers have different germanium concentrations.

4. The transistor according to claim 1, wherein the second layers have the same germanium concentration.

5. The transistor according to claim 1, wherein the second layer connected by the channel and belonging to the source electrode is arranged at the same level of the alternation of layers of the source electrode as the corresponding second layer of the drain electrode.

6. The transistor according to claim 1, wherein the alternations of layers forming the source and drain electrodes are formed in the same stack of layers.

7. The transistor according to claim 1, wherein the channel is substantially cylindrical.

8. The transistor according to claim 1, wherein the gate electrode completely encases the channel.

9. The transistor according to claim 1, wherein the transistor comprises several channels.

10. A method for producing a transistor according to claim 1, successively comprising:
    producing an alternation of first and second layers of germanium and silicon compound on a substrate, the first layers having a germanium concentration comprised between 0% and 10% and the second layers having a germanium concentration comprised between 10% and 50%, the stack beginning and ending with a first layer,
    etching, in said stack, of source and drain zones designed to form the source electrode and drain electrode, and of a narrow zone connecting the source and drain zones and corresponding to the location of the channels to be formed,
    performing superficial thermal oxidation of said stack so as to oxidize the silicon of the germanium and silicon compound in the narrow zone, the compound having a germanium concentration comprised between 10% and 50% and so as to condense the germanium, thus forming the channels,
    removing the oxidized silicon from the narrow zone,
    depositing a gate dielectric on the condensed germanium of the narrow zone,
    depositing a gate metal on said gate dielectric.

11. The method according to claim 10, wherein the thickness of the second layers is between 5 and 30 nanometers.

12. The method according to claim 10, wherein the narrow zone has lateral dimensions between 3 and 50 nanometers and longitudinal dimensions between 5 nanometers and 1 micrometer.

13. The method according to claim 10, wherein removal of the oxidized silicon from the narrow zone is accompanied by a selective etching step of the residual silicon of the narrow zone.

14. The method according to claim 10, wherein the first and/or second layers are doped.

15. The method according to claim 14, comprising selective doping of the two zones designed to form the source and drain electrodes, before the gate dielectric is deposited on the germanium.

16. The method according to claim 10, wherein, before deposition of the gate dielectric, a part of the first layers arranged facing the channel is oxidized so as to achieve spacers between the first layers of the source and drain and the gate electrode.

17. The transistor according to claim 1 wherein the channel has a lower thickness and a lower width compared to the connected second layers of the source electrode and of the drain electrode.

18. A transistor comprising:
    first layers made from a germanium and silicon compound with a germanium concentration between 0% and 10%, second layers made from a germanium and silicon compound with a germanium concentration between 10% and 50%, a source electrode and a drain electrode, each formed by an alternation of first layers and the second layers, a top channel connecting a top second layer of the source electrode to a top second layer of the drain electrode, a bottom channel connecting a bottom second layer of the source electrode to a bottom second layer of the drain electrode, a gate electrode encasing the top and bottom channels, wherein each channel has a greater germanium concentration compared to the associated second layer.

* * * * *

UNITED STATES PATENT AND TRADEMARK OFFICE
CERTIFICATE OF CORRECTION

| | | |
|---|---|---|
| PATENT NO. | : 7,829,916 B2 | Page 1 of 1 |
| APPLICATION NO. | : 11/920835 | |
| DATED | : November 9, 2010 | |
| INVENTOR(S) | : Yves Morand et al. | |

It is certified that error appears in the above-identified patent and that said Letters Patent is hereby corrected as shown below:

On the Title page, change item (73) to:

(73) Assignee: Commissariat a L'Energie Atomique
Paris (FR)

STMicroelectronics SA
Montrouge (FR)

Signed and Sealed this
Fourteenth Day of June, 2011

David J. Kappos
*Director of the United States Patent and Trademark Office*